(12) United States Patent
Nurnus et al.

(10) Patent No.: US 8,709,850 B2
(45) Date of Patent: Apr. 29, 2014

(54) METHOD FOR PRODUCTION OF A THERMOELECTRIC APPARATUS

(75) Inventors: Joachim Nurnus, Neuenburg (DE); Fritz Volkert, Oberwil (CH); Axel Schubert, Munich (DE)

(73) Assignee: Micropelt GmbH, Freiburg (DE)

( * ) Notice: Subject to any disclaimer, the term of this patent is extended or adjusted under 35 U.S.C. 154(b) by 544 days.

(21) Appl. No.: 13/000,576

(22) PCT Filed: Jun. 23, 2009

(86) PCT No.: PCT/EP2009/057780
§ 371 (c)(1),
(2), (4) Date: Apr. 26, 2011

(87) PCT Pub. No.: WO2009/156382
PCT Pub. Date: Dec. 30, 2009

(65) Prior Publication Data
US 2011/0111546 A1    May 12, 2011

(30) Foreign Application Priority Data
Jun. 25, 2008 (DE) .......................... 10 2008 030 191

(51) Int. Cl.
*H01L 21/02* (2006.01)
(52) U.S. Cl.
USPC .......... 438/54; 438/55; 136/201; 257/E21.002
(58) Field of Classification Search
USPC ...................................... 438/54, 55; 136/201
See application file for complete search history.

(56) References Cited

U.S. PATENT DOCUMENTS

| | | | |
|---|---|---|---|
| 5,824,561 A | 10/1998 | Kishi et al. | |
| 2005/0045702 A1 | 3/2005 | Freeman et al. | |
| 2005/0139249 A1 | 6/2005 | Ueki et al. | |
| 2006/0107989 A1 | 5/2006 | Bierschenk et al. | |
| 2007/0062571 A1 | 3/2007 | Hayashi | |

FOREIGN PATENT DOCUMENTS

| | | |
|---|---|---|
| DE | 69535276 T2 | 8/2007 |
| EP | 0 821 417 | 1/1998 |
| EP | 1 118 127 A1 | 4/2000 |
| WO | 00/19548 A1 | 4/2000 |
| WO | 03/105244 A1 | 12/2003 |

*Primary Examiner* — Alexander Ghyka
(74) *Attorney, Agent, or Firm* — Maschoff Brennan

(57) ABSTRACT

The invention relates to a method for production of at least one thermoelectric apparatus with the steps of: preparation of a first wafer (1) which is formed from a thermoelectric material of a first conductivity type; preparation of a second wafer which is formed from a thermoelectric material of a second conductivity type; structuring of the first wafer (1) so that a group of first thermoelectric structures (7) is produced; structuring of the second wafer so that a group of second thermoelectric structures is produced; and linking of the first to the second wafer in such a manner that the first and the second thermoelectric structures are electrically connected together and thus form the thermoelectric apparatus. According to the invention, before the structuring of the first wafer (1), a first contact material (3) is deposited on the first wafer (1) and/or before the structuring of the second wafer, a second contact material is deposited onto the second wafer.

18 Claims, 6 Drawing Sheets

METHOD FOR PRODUCTION OF A THERMOELECTRIC APPARATUS

BACKGROUND

The invention relates to a method for producing at least one thermoelectric apparatus. Such a method is for instance known from EP 1 118 127 B1.

SUMMARY

The object to be solved by the invention is to provide a preferably simple and preferably inexpensive method for producing a thermoelectric apparatus.

According to the invention, a method is provided, that comprises the steps of
providing a first wafer, which is formed from a thermoelectric material of a first conductive type;
providing a second wafer, which is formed from a thermoelectric material of a second conductive type,
structuring of the first wafer so that a group of first thermoelectric structures is produced;
structuring of the second wafer so that a group of second thermoelectric structures is produced;
linking the first to the second wafer such that the first and the second thermoelectric structures are electrically connected to each other, for instance are connected in series and such the thermoelectric apparatus is produced, whereby
before structuring the first wafer a first contact material is deposited on the first wafer and/or before the structuring of the second wafer a second contact material is deposited on the second wafer.

The method according to the invention does therefore provide not to deposit the thermoelectric material as a layer on a substrate during the production of a thermoelectric apparatus (that means of a thermoelectric heating and/or cooling element or a thermogenerator), but rather to provide the material in form of a wafer and to structure said wafer.

A "wafer" is hereby designated as a bulk material, whereby the geometry of the wafer can be arbitrary, for instance rectangular or round. The "wafer" is in particular a disk-shaped material that comprises for instance a thickness between 100 µm to 500 µm.

The production step of deposition of a (electrically conductive) contact material (in particular in form of a layer), whereby from said material electrical contacts to the respective first and/or second structures are produced, occurs on the thermoelectric wafer and not on a substrate (formed from a non-thermal electrical material). The contact material comprises for instance Titan, Platin, Bismuth, Gold or Copper. The "deposition" of the contact material comprises in particular the production of the contact layer by the means of galvanic or a PVD-method, for instance sputtering or electron beam evaporation. The connecting (bonding) of a substrate, at which a contact layer was produced, to the thermoelectric wafer, so that the contact layer gets in contact with the wafer, is not included.

The first contact material, which is produced on the first wafer, can be identical to the second contact material, which is produced on the second wafer. This is however not necessarily required. In analogy the first and the second thermoelectric material and/or the first and the second thermoelectric structures can be identical or can be formed identically.

A "thermoelectric material" is a material which has a thermoelectric coefficient, which is high enough in order to realize a thermoelectric element with said material. A thermoelectric material for the first and/or the second wafer is for instance a material of the main group V-VI or IV-VI, for instance Bismuth Telluride or Lead Selenide, but also Silicon-Germanium.

In an embodiment of the invention a (first or second) contact material is deposited on the first as well as on the second wafer. After linking the first to the second wafer the first and the second thermoelectric structures are electrically connected in series via the first and the second contact material.

In another variant of the invention by structuring the first and the second wafers in each case a majority of groups of structures and a multitude of groups of second structures is produced such that by linking the first to the second wafer a majority of thermoelectric apparatus are formed. In other words, the wafers to be linked to each other are in each case structured such that a multitude of thermoelectric apparatus is produced.

The production of the majority of the thermoelectric apparatus occurs thereby through processing the wafer. The separation (separating from each other) of the thermoelectric apparatus occurs only after the linking of the first to the second wafer, for instance by sawing or etching.

The first and/or the second contact material are in particular structured such that in each case a majority of first electrical contacts for the first structures to be produced and/or a majority of second electrical contacts for the second structures to be produced is formed.

The first or second structures to be produced by structuring the first or second wafers can be for instance longitudinally extending elements (legs) or columns. Accordingly, the first or second electrical contacts produced by the structuring of the first or the second contact layer can form longitudinal or rectangular planes, which are connected to the first or second thermoelectric structures and be in electrical contact.

In a further improvement of the method according to the invention, a diffusion barrier layer is produced on the first and/or the second wafer before depositing the contact material for instance galvanically, via CVD or PVD.

Furthermore, it is provided according to another embodiment of the invention that
the first carrier for mechanical stabilization of the wafer is arranged on at least one of the wafers, that means on the first and/or the second thermoelectric wafer, whereby
the second carrier is arranged on a side of the wafer, which faces away from the side of the wafer on which the contact material is arranged or is to be arranged, and/or
a second carrier is arranged for mechanical stabilization of the wafer, whereby
the second carrier is arranged on a side of the wafer, on which the contact material is arranged or is to be arranged.

The first and/or the second carrier can be formed for instance continuously or can be designed in form of a frame. The arrangement of the first carrier occurs in particular before the deposition of the contact material. Furthermore, the first carrier can be removed before structuring of the wafer.

It is pointed out that a carrier can be arranged on each side of the thermoelectric wafer. This is however not necessarily required, also only one carrier can be used for mechanical stabilization. For example, only the second carrier can be provided, that means only one carrier, which is arranged on the side of the contact material. In particular a thermoelectric wafer with a thickness is used, which allows for a secure handling of the wafer, for instance a thickness of at least 500 µm. After arranging the (second) carrier the thermoelectric wafer is thinned (for instance via CMP) onto the thickness for instance 100 µm required for the thermoelectric apparatus.

The first or the second carrier serve furthermore for the mechanical stabilization, said carrier can however also have further functions, for instance forming an electric contact.

In a variant a solder material is produced on the first carrier before arranging said carrier on the wafer, whereby the solder material remains on the wafer after the removal of the first carrier. The linking of the two wafers, that means the first to the second wafer, comprises the linking of the thermoelectric structures of the wafer (that means of the first or the second wafer) to the other of the two wafers (that means to the second or the first wafer) via the solder material. An alloy, for instance of Bismuth-Gold, can be used as solder material, in particular if the thermoelectric wafer consists of Bismuth Telluride.

The first and/or the second carrier are for instance produced galvanically. Thereby, the thickness of the carrier is selected such that a stabilisation of the respective thermoelectric wafer is obtained. The second carrier is in particular a copper layer with a thickness between 50 µm and 200 µm.

In a further embodiment the second carrier is arranged on a side of the wafer facing away from the first carrier and the first carrier is removed after the arrangement of the second carrier.

In an embodiment one of the two thermoelectric wafers is a Si—Ge-wafer of the first conductive type. The first carrier is a Silicon wafer, on which a solder layer or multiple material layers for forming a solder material are produced before the linking to the Si—Ge-wafer. The Silicon wafer is linked to the Si—Ge-wafer, for instance by bonding after the production of the solder material on the Silicon wafer.

Then, a contact material and a second carrier, for instance a galvanically produced Copper layer, are arranged on the side of the Si—Ge-wafer opposing the Silicon wafer. Subsequently, the Si—Ge-wafer is structured for producing (first) thermoelectric structures. After the arrangement of the second carrier the Silicon wafer is removed, whereby the solder material remains on the Si—Ge-wafer. The Si—Ge-wafer is connected to a second, for instance a further (also structured) Si—Ge-wafer of another conductive type, via the solder material. The processing (structuring) of the second Si—Ge-wafer occurs in particular in analogy to the first Si—Ge-wafer.

In another variant the silicon wafer, that means the first carrier, is not provided with a solder material but rather the arrangement of the solder material occurs on the Si—Ge-wafer after producing the second carrier and the separation of the silicon wafer from the Si—Ge-wafer. Thereby the solder material is produced on a side of the Si—Ge-wafer facing away from the second carrier.

It is mentioned that the first carrier does not of course has to be necessarily a silicon wafer. Also other, for instance, disk-shaped materials can be used as carriers, which allow a stabilization of the wafer.

Furthermore, after the structuring of at least one of the thermoelectric wafers (and for instance also after linking of the first to the second wafer) a good thermal conductive carrier can be arranged on the wafer. This good thermal conductive carrier can be linked to the (second) carrier, which is arranged on the side of the wafer on which the contact material was deposited.

In a further variant of the invention a fusion barrier layer is produced on the first and/or the second wafer before the deposition of the contact material as contact layer, whereby the arrangement of the diffusion barrier layer occurs after the arrangement of the first carrier so that said carrier is at least sectionally covered by the diffusion barrier layer.

Furthermore, the first and/or the second contact material can be formed such that it mechanically stabilises the respective wafer. This can occur in particular by producing the second contact material with an appropriate thickness. The mechanical stabilisation of the wafer occurs for instance exclusively by the contact material and not by additional stabilisation carriers.

In a further example the first and/or the second contact material can be deposited by using a mask arranged on the respective wafer so that the first and/or the second contact material form in each case a majority of first and/or second contacts, which should serve as an electrical contact to the thermoelectric structures to be produced.

Thereby the mask remains on the wafer and isolates in the first and/or second contact electrically from each other. The mask is in particular made of a structured photoresist, which is arranged on the wafer. The contacts are for instance produced galvanically using the structured photoresist.

The contacts and the mask remaining on the wafer can be for instance formed such that they form a carrier layer, which mechanically stabilises the wafer; in particular by producing the contacts and the mask with a sufficient thickness therefor. Therefore, the contacts serve on the one hand the electrical contact of the thermo-electrical structures and together with the mask remaining on the wafer for further mechanical stabilisation of the wafer.

The structuring of the first and/or the second wafer which serves for producing the groups of first or second thermoelectric structures, occurs for instance by etching or sawing for instance by laser, water- or sandblasting.

BRIEF DESCRIPTION OF THE DRAWINGS

The invention is being explained by more detail in the following by means of examples referring to the figures, wherein.

DETAILED DESCRIPTION

FIGS. 1 to 11 show schematically method steps during the processing of the first thermoelectric wafer 1, which occur before linking the first wafer 1 to a second thermoelectric wafer (not shown).

The thermoelectric wafer is made of a thermoelectric active material of a first conductive type that means an n- or p-doped material. The second thermoelectric wafer, which is linked to the first wafer, is made of a material of a second conductive type that means complementary to the first wafer a p- or n-doped thermoelectric active material. The second wafer can be processed in analogy to the first wafer according to the method steps of FIGS. 1 to 11.

Figure 1:
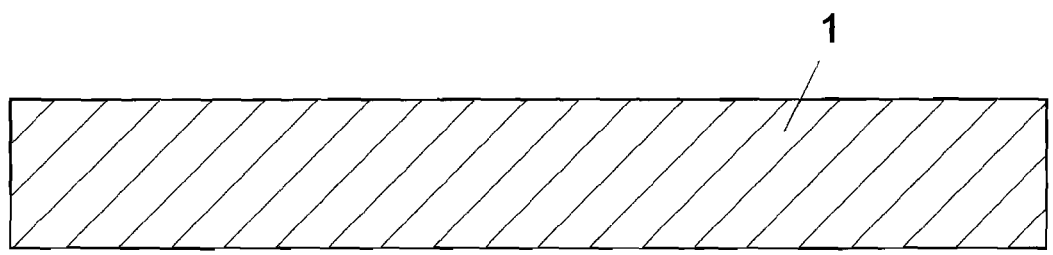
FIGS. 1 to 9 show a first embodiment of the method according to the invention.

The thermoelectric wafer 1 is processed of one of both sides according to FIG. 1 for improving the surface and/or for reducing thickness, for instance by chemical-mechanical polishing (CMP).

In a subsequent step (FIG. 2) the wafer 1 is provided with a diffusion barrier layer 2, for instance galvanically or by means of PVD- or CVD-method. The material for the diffusion barrier layer is in particular a metallic material, as for instance nickel or platinum, which shall reduce or completely avoid a diffusion of the contact material into the thermoelectric wafer.

Figure 2:
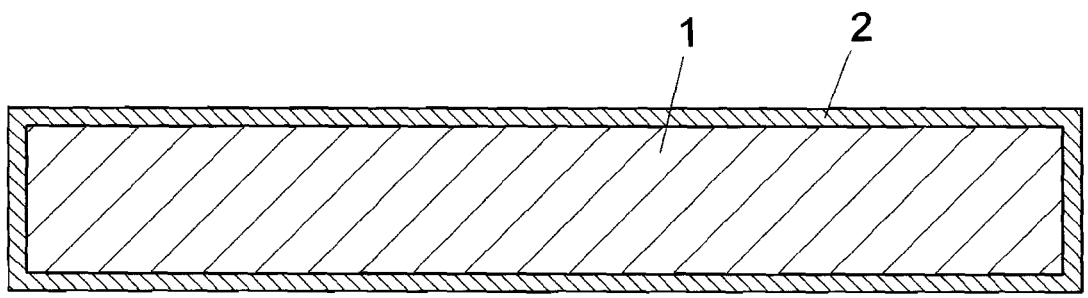

It is to be pointed out that the diffusion barrier layer 2 is not necessarily produced on both sides of the wafer 1—as shown in FIG. 2. It can also be provided that the diffusion barrier layer does not completely enclose the wafer and is for instance only arranged on one side or only sectionally arranged on one side of the wafer 1.

Figure 3:
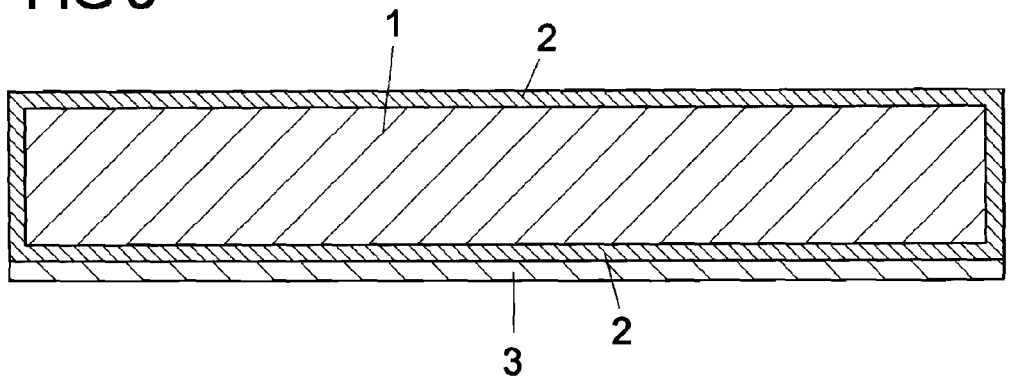

FIG. 3 shows that after the production of the diffusion barrier layer 2 a (first) contact material in form of a (first) contact layer 3 is deposited on the (first) thermoelectric wafer 1. The deposition of the contact layer 3 can occur for instance via galvanic, electron beam evaporation or sputtering. It is not necessarily required that the contact layer 3 covers the complete side of the wafer 1, for instance the deposition of the contact layer can also occur such that only sections of a side of the wafer 1 are covered.

Figure 4:
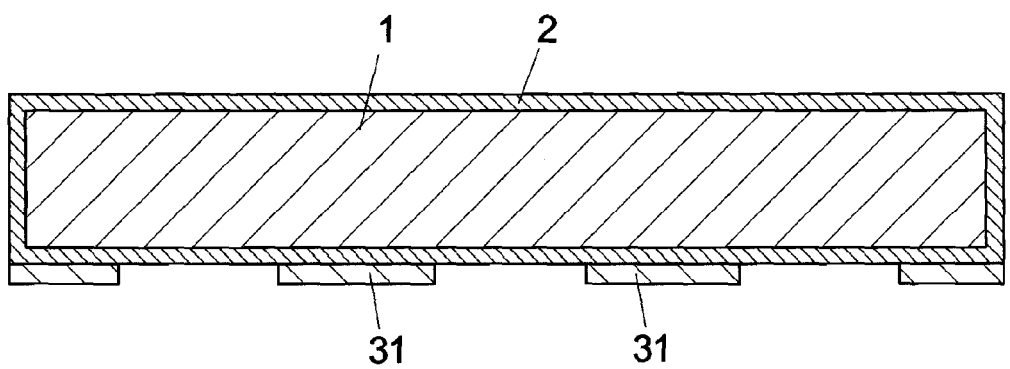

According to FIG. 4, the contact layer 3 is structured such that a majority (first) of electrical contacts 31 is produced. The contacts 31 serve later to link electrically the (first) thermoelectric structures to be produced to the second thermoelectric structures to be produced in the second thermoelectric wafer with each other, in particular to be connected in series. The contacts 31 are for instance designed as rectangular or striped planes.

It is to be pointed out that the production of the contacts 31 does not have necessarily to occur by structuring a previously deposited contact layer. In another variant of the invention, singular contact structures 31 are directly produced for instance by a lift-off-process or galvanic using a mask material (for instance structured photoresist) structured accordingly.

Figure 5:
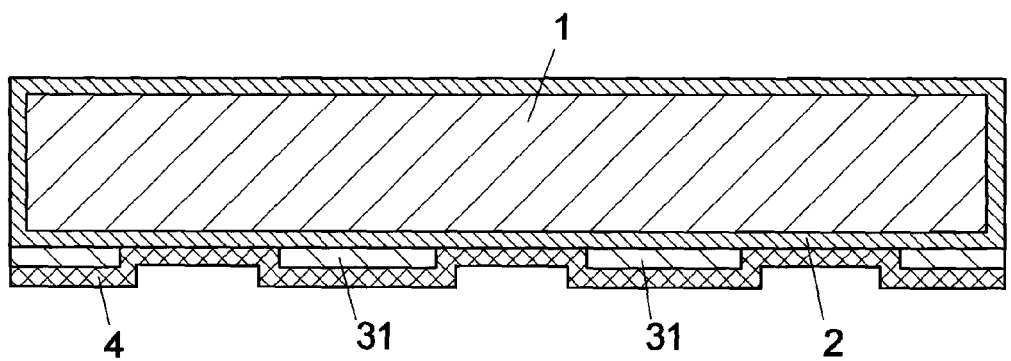

After producing the contacts 31, an insulating layer 4 is arranged according to FIG. 5 which covers at least some of the contacts 31 and the space between contacts 31 so that these are electrically insulated from each other. Material for the insulation layer is for instance silicon oxide or silicon nitride, which can be in particular produced by PVD or CVD.

Figure 6:
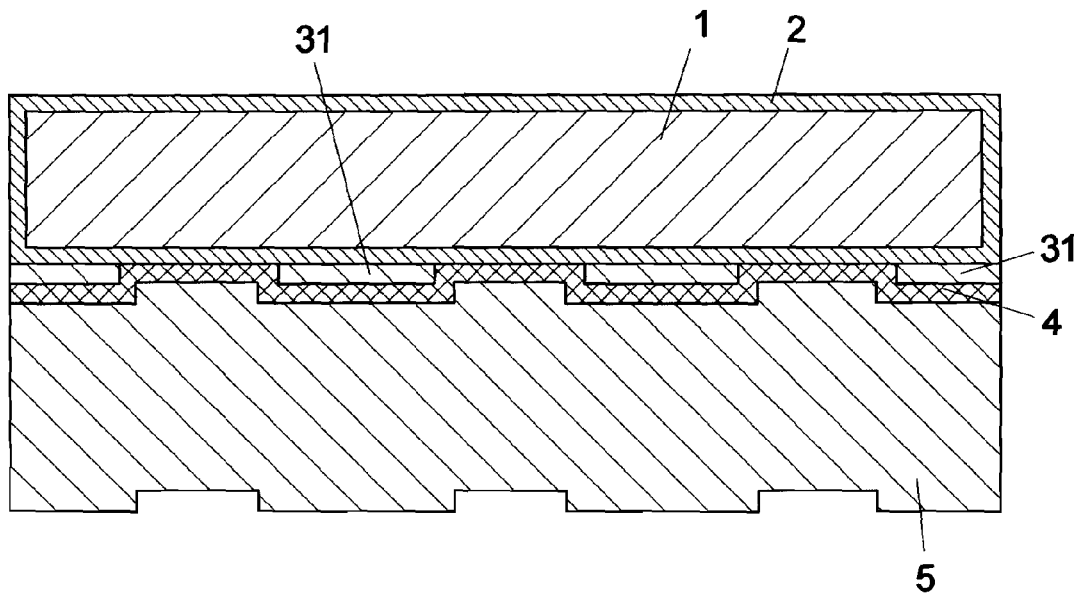

After producing the insulating layer 4, the (second) carrier in form of a galvanically produced carrier layer 5, for instance a copper layer, is arranged on the side, on which the contacts 31 are arranged. This is shown in FIG. 6. In the present embodiment the insulation layer 4 separates the contact 31 from the carrier layer 5.

Figure 7:
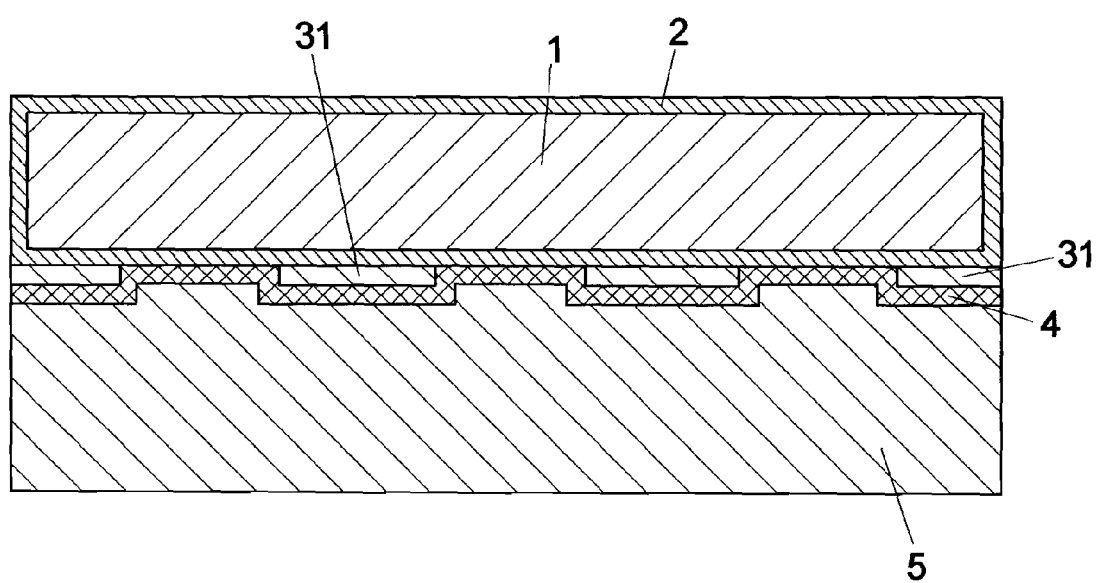

The carrier layer 5 can comprise recesses in the area of the space between adjacent contacts 31. Therefore, a smoothing or thinning of the carrier layer 5 can optionally occur for instance by CMP (FIG. 7). The thickness of the carrier layer 5 is in particular formed also after the polishing such that it contributes to a stabilization of the wafer 1.

Figure 8:
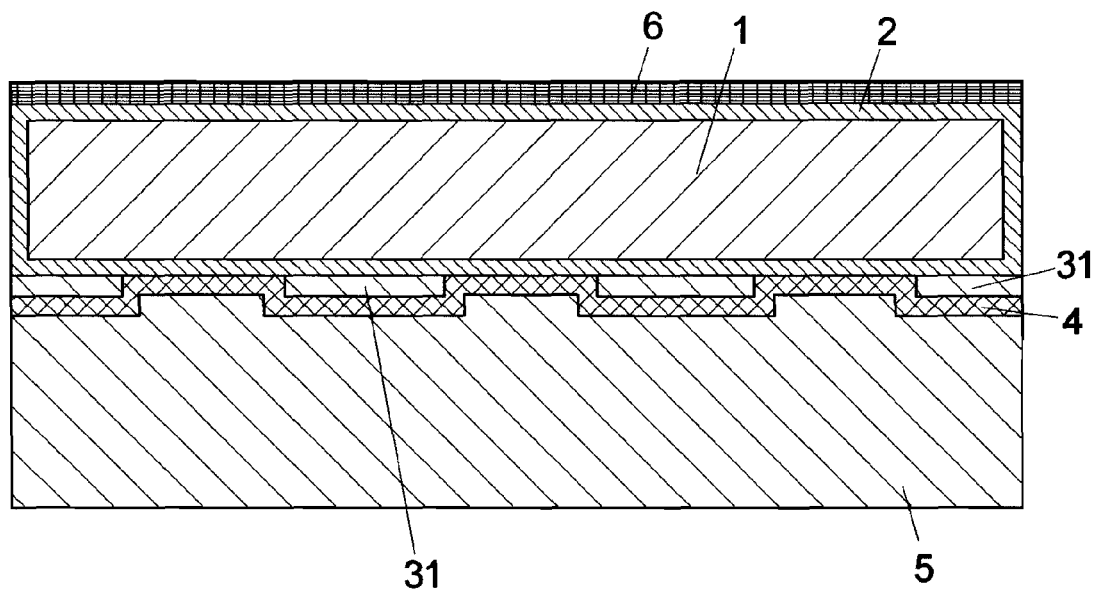

After the arrangement of the carrier layer 5, a solder material in form of a solder layer 6 is arranged on the side of the wafer 1 facing away from the contacts 31 according to FIG. 8, for instance by evaporating or sputtering. The solder layer 6 can comprise for instance a metallic alloy, for instance bismuth-gold.

The solder layer 6, the diffusion barrier layer 2 as well as the thermoelectric wafer 1 are subsequently structured (for instance by etching and/or sawing) so that a majority of thermoelectric structures 7 is produced, which comprise section 61, 21, 11, 22 of the respective layers arranged above each other. The structuring of the solder layer 6, the diffusion barrier layer 2 as well as the thermoelectric material 1 can be carried out in one step or in multiple sub-steps. The thickness of the contact layer is sufficiently large selected so that a complete removal of the contacts 31 during structuring of the solder layer 6, the diffusion barrier layer 2 and the thermoelectric material 1 is avoided, in particular if this is being done by sawing. Furthermore, the thickness of the contact layer can be selected such that variability of the thickness of the thermoelectric wafer are balanced.

The structuring of the thermoelectric wafer 1 as well as the diffusion barrier layer 2 and the solder layer 6 occurs such that the thermoelectric structure 7 are distant from each other and are formed for instance column- or leg-like.

The thermoelectric structures 7 are produced in the area of the electric contacts 31, whereby said structures are in particular positioned in respect to the contacts 31 such that the contacts 31 have in each case free sections, onto which the corresponding (second) thermoelectric structures of the second thermoelectric wafer can be placed, if the first wafer is linked to the second wafer.

It is to be mentioned that the FIGS. 1 to 12 are schematically in so far that they show the method by means of the production of four thermoelectric structures. The method steps can of course also be carried out such that less or in particular also more thermoelectric structures can be produced, which can also form for instance a plurality of thermoelectric apparatus after linking the wafer.

Before linking the first wafer 1 to the second wafer, thermoelectric structures 7, in particular in the area of their respective side walls, can be provided with a protective (passivating) layer. The protective layer prevents for instance, that during linking the first to the second wafer, solder material reaches the side walls of the thermoelectric structures and worsens the electrical behaviour of the thermoelectric apparatus. The protective layer can also be designed such to protect the thermoelectric structures (already before the linking of the layer) from environmental influences, in particular from humidity.

The protective layer is for instance formed in an example in form of a polymer layer, (for instance photoresist, polyimide or BCB). A thin polymer layer is in particular used for instance with a thickness of a view micrometers.

It is to be pointed out that besides the process steps shown in the FIGS. 1 to 9 additional or alternative production steps can be provided during processing the first and/or the second wafer.

Figure 10:
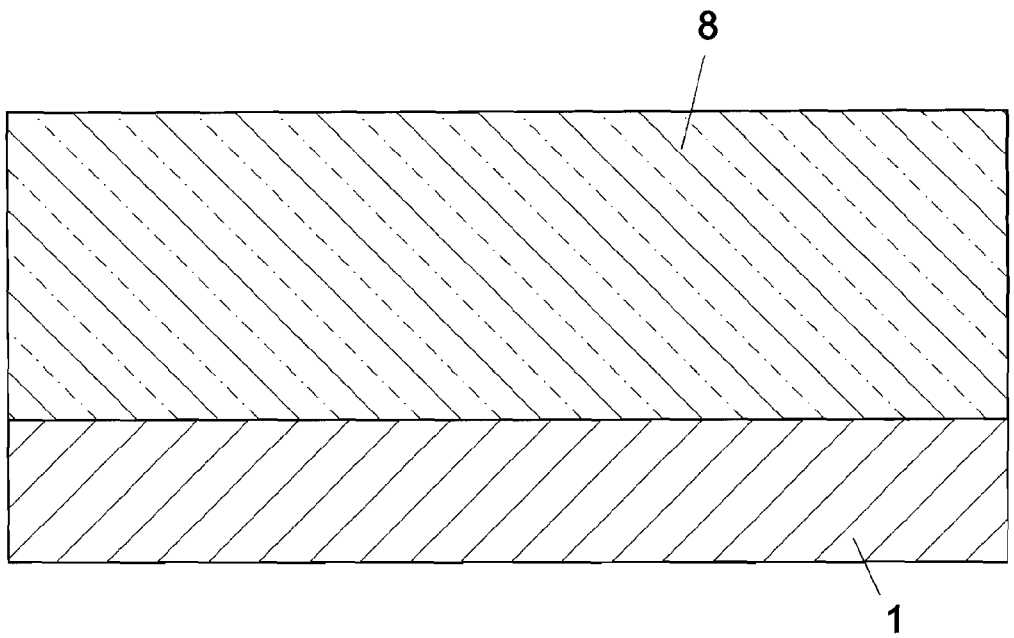
FIGS. 10 and 11 illustrate an improvement of the method of the FIGS. 1 to 9.
Figure 11:
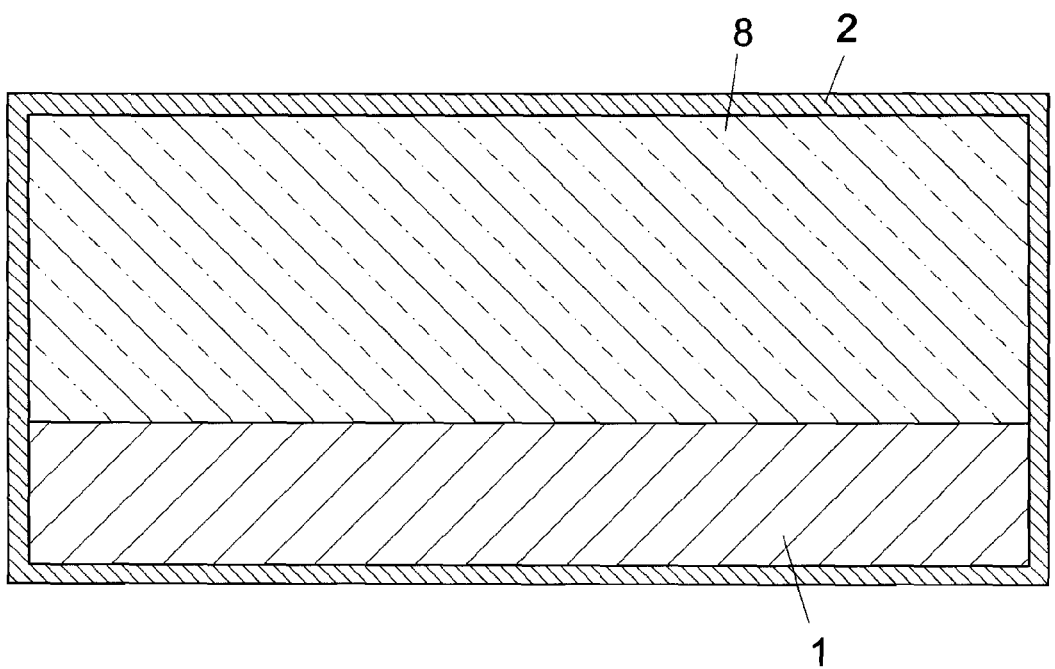

The FIGS. 10 and 11 relate to an improvement of the previously described method. Accordingly, a (first) carrier in form of a substrate 8 is arranged on a first thermoelectric wafer 1 before producing the contact layer and before producing the diffusion barrier layer (compare FIG. 2). More specifically, the substrate 8 is arranged on a side of a thermoelectric wafer 1, for instance by bonding, which opposes the side of the wafer, on which the electrical contact layer (compare FIG. 3) is to be produced.

In FIG. 11 it is shown that after the arrangement of the substrate 8, the diffusion barrier layer 2 is produced, whereby a side of the substrate 8 is also covered with the diffusion barrier layer. The arrangement of the diffusion barrier layer 2 can, however, also occur such that said barrier layer is only formed in an area of the thermoelectric wafer that means in particular on a side of the wafer which opposes the substrate 8.

Figure 9:
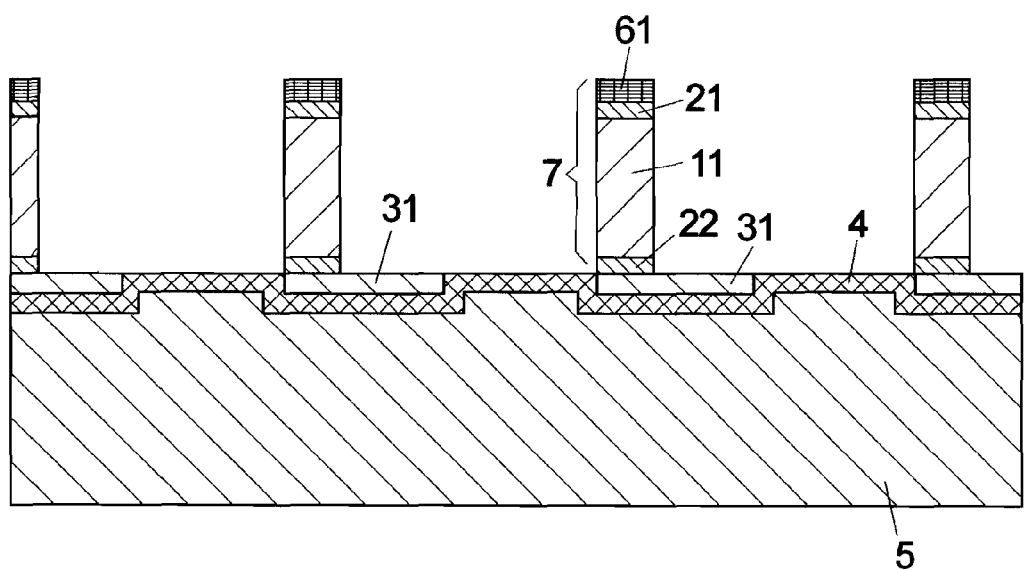

After arranging the diffusion barrier layer 2 occur for instance the production steps according to the FIG. 3 or 9, that means the galvanically produced (second) carrier 5 is arranged additionally to the substrate 8. In another variant of the invention the use of the second carrier 5 is however avoided and the stability of the thermoelectric wafer 1 is only guaranteed by the substrate 8. The substrate 8 is removed before linking the (first) wafer 1 to the second wafer, in particular before structuring the wafer 1.

Figure 12:
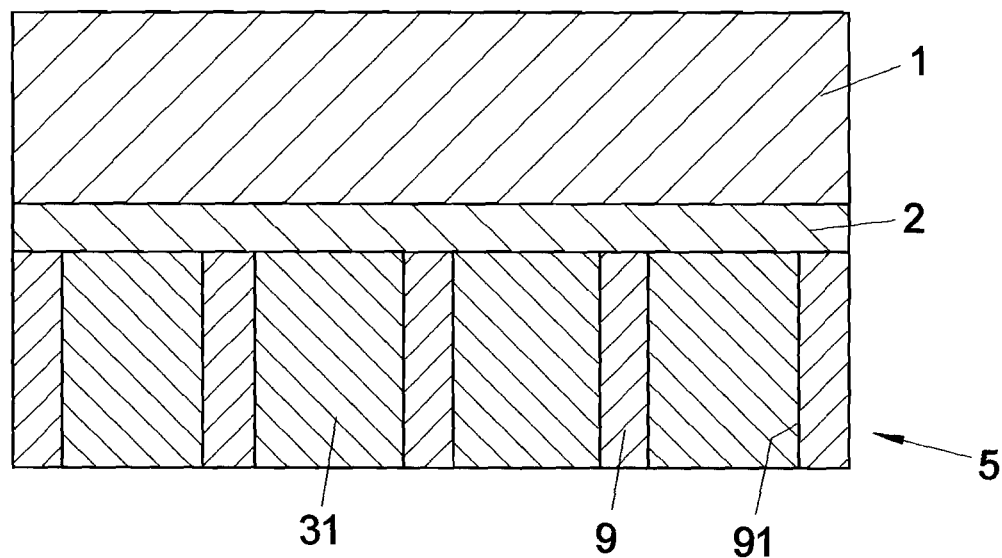
FIG. 12 shows a further embodiment of the invention of the method according to the invention.

FIG. 12 relates to a further embodiment of the method according to the invention. In difference to FIGS. 3 to 6 no contact layer is deposited on the thermoelectric wafer 1 for producing the contacts, whereby said contact layer is structured in a subsequent step. Instead a mask 9 of lithographic structured photoresist (for instance SU-8) is arranged on the wafer, whereby said mask comprises openings 91 distant to each other.

A galvanic step is carried out using the wafer prepared in this manner so that a metal, for instance copper, is deposited on the wafer in the area of the openings 91. The openings 91 are designed and arranged such that the material deposited galvanically forms contacts 31, which serves for contacting of the (still to be produced) thermoelectric structures.

The mask 9 remains after completion of the contacts 31 on the wafer so that the contacts 31 are electrically insulated from each other by the remaining mask 9. The rib-like photoresist structures of the mask 9, which continue vertical to the thermoelectric wafer 1, serve simultaneously for a mechanical stabilisation of the wafer 1. The mask 9 and the contacts 31 formed in the openings 91 of the mask form therefore a carrier layer, which mechanically stabilises the wafer 1. For this reason, the thickness of the mask is in particular selected accordingly, for instance between 100 μm and 200 μm.

After completion, the contacts 31 can be planerized together with the remaining mask. Subsequently, further processing steps are carried out with the wafer 1, for instance according to the above described FIGS. 8 and 9.

LIST OF REFERENCE SIGNS

1 thermoelectric wafer
2 diffusion barrier layer
3 contact layer
4 insulating layer
5 second carrier
6 solder layer
7 thermoelectric structure
8 first carrier
9 mask
11 section of the thermoelectric wafer
21, 22 section of the diffusion barrier layer
31 electric contacts
61 section of the solder layer
91 opening

The invention claimed is:

1. A method for production of at least one thermoelectric apparatus with the steps of:
   providing of a first wafer, which is formed of a thermoelectric material of a first conductivity type;
   providing of a second wafer, which is formed of a thermoelectric material of a second conductivity type;
   structuring of the first wafer, so that a group of first thermoelectric structures is produced;
   structuring of the second wafer, so that a group of second thermoelectric structures is produced;
   linking of the first to the second wafer in such a manner that the first and the second thermoelectric structures are electrically connected together and thus form the thermoelectric apparatus,
   wherein before the structuring of the first wafer a first electrically conductive contact material is deposited onto the first wafer and before the structuring of the second wafer a second electrically conductive contact material is deposited on the second wafer;
   wherein after linking the first to the second wafer the first and the second contact material each form an electrical connection between the first and the second thermoelectric structures;
   wherein a first carrier is arranged on at least one of the wafers for mechanical stabilization of the wafer, whereby
   the first carrier is arranged on a side of the wafer which faces away from the side of the wafer on which the contact material is arranged or is to be arranged;
   wherein the first carrier is arranged before the deposition of the contact material; and
   wherein the first carrier is removed before the structuring of the wafer.

2. The method according to claim 1,
   wherein the first and the second thermoelectric structures are electrically connected in series via the first and the second contact material.

3. The method according to claim 1, wherein due to the structuring of the first and the second wafer in each case a plurality of groups of first structures and a plurality of groups of second structures are produced such that by linking the first to the second wafer a plurality of thermoelectric apparatus are formed.

4. The method according to claim 3, wherein the thermoelectric apparatus are separated from each other.

5. The method according to claim 1, wherein the first and the second contact material each is deposited as a contact layer, wherein the contact layer is structured in such a way that in each case a plurality of first electrical contacts for the first structures to be produced and/or a plurality of second electrical contacts for the second structures to be produced are obtained.

6. The method according to claim 1, wherein before depositing the contact material a diffusion barrier layer is produced on the first and/or the second wafer.

7. The method according to claim 1, wherein
   a second carrier is arranged for mechanical stabilization of the wafer, whereby
   the second carrier is arranged on a side of the wafer on which the contact material is arranged or is to be arranged.

8. The method according to claim 1, wherein
   a solder material is produced on the first carrier before arranging said carrier on the wafer, whereby
   the solder material remains after the removal of the first carrier on the wafer, and
   the linking of the two wafers comprises the linking of the thermoelectric structures of the wafer to the other of the two wafers via the solder material.

9. The method according to claim 7, wherein
   the second carrier is arranged on a side of the wafer facing away from the first carrier and
   the first carrier is removed after the arrangement of the second carrier.

10. The method according to claim 7, wherein the second carrier is arranged after depositing the contact material.

11. The method according to claim 7, wherein the second carrier is galvanically produced.

12. The method according to claim 1, wherein the first and/or the second contact material are formed such that said material stabilizes mechanically the respective wafer.

13. A method for production of at least one thermoelectric apparatus with the steps of:

providing of a first wafer, which is formed of a thermoelectric material of a first conductivity type;
providing of a second wafer, which is formed of a thermoelectric material of a second conductivity type;
structuring of the first wafer, so that a group of first thermoelectric structures is produced;
structuring of the second wafer, so that a group of second thermoelectric structures is produced;
linking of the first to the second wafer in such a manner that the first and the second thermoelectric structures are electrically connected together and thus form the thermoelectric apparatus,
wherein before the structuring of the first wafer a first electrically conductive contact material is deposited onto the first wafer and before the structuring of the second wafer a second electrically conductive contact material is deposited on the second wafer;
wherein after linking the first to the second wafer the first and the second contact material each form an electrical connection between the first and the second thermoelectric structures, wherein
the first and the second contact material are deposited using a mask arranged on the respective wafer so that the first and the second contact material form in each case a plurality of first and second contacts, wherein the first and the second contacts form the electrical connection between the first and the second thermoelectric structures, whereby
the mask remains on the wafer and isolates in each case the first and the second contacts electrically from each other.

14. The method according to claim 7, wherein before depositing the contact material a diffusion barrier layer is produced on the first and/or the second wafer, wherein the diffusion barrier layer occurs after the arrangement of the first carrier such that said carrier is at least sectionally covered by the diffusion barrier layer.

15. The method according to claim 1, wherein the first and/or the second wafer comprise Bismuth Telluride, Lead Selenide or Silicon-Germanium.

16. The method according to claim 1, wherein the structuring of the first and/or the second wafer is carried out via etching or sawing.

17. The method according to claim 1, wherein the thermoelectric apparatus is a thermoelectric heating and/or cooling element or a thermoelectric generator.

18. The method according to claim 1, wherein the first contact material forms a plurality of electrical contacts, each having a free section onto which one of the second thermoelectric structures can be placed.

* * * * *

UNITED STATES PATENT AND TRADEMARK OFFICE
CERTIFICATE OF CORRECTION

PATENT NO. : 8,709,850 B2  
APPLICATION NO. : 13/000576  
DATED : April 29, 2014  
INVENTOR(S) : Nurmus et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 664 days.

Signed and Sealed this

Twenty-ninth Day of September, 2015

Michelle K. Lee  
*Director of the United States Patent and Trademark Office*